United States Patent [19]
Eriksson

[11] Patent Number: 4,508,748
[45] Date of Patent: Apr. 2, 1985

[54] MANUFACTURING PROCESS FOR SELENIUM PHOTORECEPTORS

[75] Inventor: Richard C. Eriksson, Kingston, Mass.

[73] Assignee: XIS, Incorporated, W. Groton, Mass.

[21] Appl. No.: 579,550

[22] Filed: Feb. 13, 1984

Related U.S. Application Data

[62] Division of Ser. No. 455,828, Jan. 5, 1983.

[51] Int. Cl.³ .............................................. B05D 3/06
[52] U.S. Cl. .......................................... 427/8; 427/39; 427/76; 427/234; 427/237; 427/238
[58] Field of Search ........................ 427/39, 8, 76, 237, 427/238, 234; 118/723, 725, 730

[56] References Cited

U.S. PATENT DOCUMENTS

4,223,048  9/1980  Engle .................................. 427/39

*Primary Examiner*—Bernard D. Pianalto
*Attorney, Agent, or Firm*—John E. Toupal; Harold G. Jarcho

[57] ABSTRACT

A vapor deposition apparatus including a vacuum chamber, a vacuum pump for evacuating the chamber, and a mounting assembly disposed within the chamber and adapted to support and electrically isolate a plurality of substrate electrode units to be coated. Electrical couplings connect the electrode units to a power supply that establishes therebetween potential gradients that produce a glow discharge and resultant heating thereof. Also disposed within the vacuum chamber is a source of evaporative coating for deposition on the glow discharge heated electrode units.

11 Claims, 8 Drawing Figures

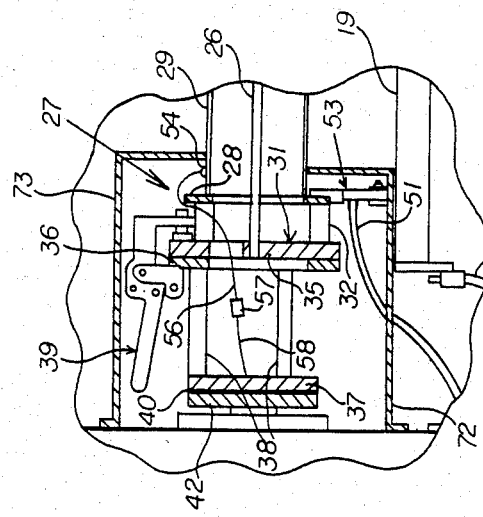
FIG. 2
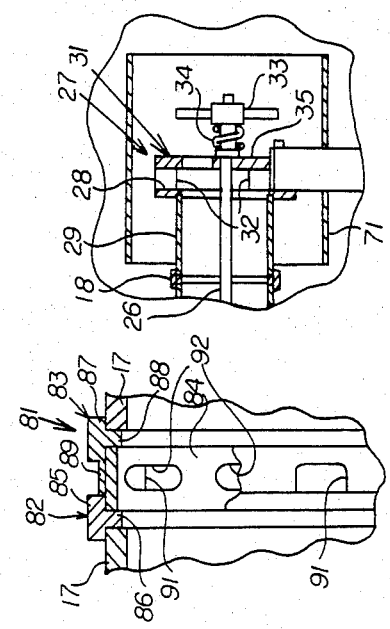
FIG. 3
FIG. 8

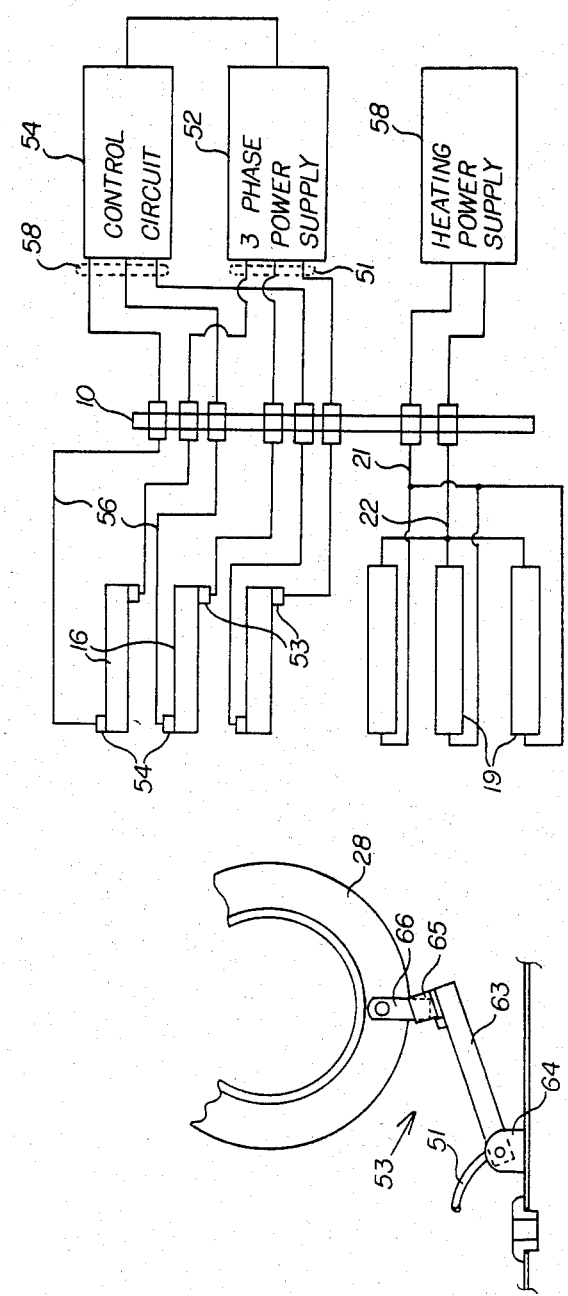

MANUFACTURING PROCESS FOR SELENIUM PHOTORECEPTORS

CROSS-REFERENCE TO RELATED APPLICATION

This invention is a division of U.S. application Ser. No. 06/455,828, filed Jan. 5, 1983, entitled "Manufacturing Process for Selenium Photoreceptors".

BACKGROUND OF THE INVENTION

The invention relates generally to a method and apparatus for producing photoreceptors and, more particularly, to a method and apparatus for producing the hollow drum selenium photoreceptors used in reproduction machines.

The photoreceptors used in reproduction equipment generally are composed of three components; (1) the conductive substrate, usually aluminum, (2) an insulating layer of aluminum oxide, usually several hundred angstroms thick, and (3) the photosensitive thin film, usually selenium or selenium alloy approximately fifty microns thick. The primary manufacturing process steps for producing the photoreceptors include: etching and cleaning the substrate, growing the aluminum oxide layer, usually in an oven, cleaning again, and finally the deposition of the photosensitive film. The etching and cleaning process is typically quite involved and requires several cleaning and rinsing tasks, including deionized water final rinses. The thermal conditioning of the photoreceptor substrate during the process is important as it defines the solidification and crystalization characteristics of the selenium or selenium alloy photosensitive material being deposited on the substrate. These characteristics in turn determine the photosensitivity of the receptor as well as such optical properties as spectral (color) response, and color peaking.

The above noted selenium and selenium alloy coating process conventionally employed to produce photoreceptors is quite well known and the design and manufacture of apparatus to perform the process, although complex, is generally within the state-of-the-art. However, one nagging problem has been an inability to consistently heat the aluminum substrates to the proper temperature and uniformity prior to the deposition of the selenium coating. The failure to achieve coating temperature objectives, can render production equipment virtually useless.

Many coating systems in the past were designed with fluid systems to heat a drum supporting mandrel and relied on conduction heat transfer to heat drum substrates. Such systems function reasonably well in air as the variations in the contacting surfaces are filled by a gaseous interface that assists the transfer of heat. In a vacuum, however, the actual contact area (and thus the heat transfer area) is a series of points, the total area of which is so small that the heating time is very long, and when coupled with any losses, markedly limits or prohibits uniform heating.

In attempts to improve the heating portion of the process, early workers in the field investigated the then evolving gaseous plasma technology as an energy source. Producing discharge to a substrate functioning as a cathode produced very uniform heating, but the plasma energy was too low to produce reasonable heating rates. After investigating the potential of confining the plasma to increase its energy in the immediate area of the substrate, the concept was abandoned due to the difficulty and potential cost of developing a machine of this nature.

The result of this early plasma research suggested that a viable solution existed if the energy could be increased. This fact moved the research toward an older and more thoroughly understood technology, electron bombardment. By controlling the voltage and current of a tungsten filament in a vacuum, it is possible to control the emission of electrons. It is further possible to direct the path of these electrons by means of proper grounding, magnetic fields and/or properly charged shields. Electrons can be emitted in sufficient quantity to achieve heating rates considerably greater than the ion bombardment of normal plasmas. By properly designing the emitting filament relative to the substrate geometry and rotating the substrate past the filament it was found that the required uniformity could be achieved. Unfortunately, the laboratory experiments did not scale up to a production machine very easily. Great difficulty was encountered in controlling the tremendous power supplies required to power the filaments. The systems were prone to generating high voltage arcs as they become more contaminated by each production cycle. The arcs very typically would backtrack through the system wiring burning out electrical components and controls. The production time of electron bombardment equipment is often less than the system down time.

The tungsten filaments required for electron bombardment systems also are a source of considerable problems. The filaments are typically 1/32" to 3/32" in diameter and from 30" to 90" long. They tend to become brittle after only a few heating cycles. Failure usually results in the destruction of some substrates and unacceptable coatings of all the substrates associated with that filament. The thermal expansion mechanism supporting the filament tends to further complicate the filament failure.

The object of this invention, therefore, is to provide an improved system for producing the selenium coated photoreceptors used in reproduction equipment.

SUMMARY OF THE INVENTION

The present invention is a vacuum deposition method including the steps of providing a vacuum chamber, disposing within the chamber a plurality of substrate electrode units to be coated, reducing the pressure within the vacuum chamber, establishing between the electrode units an electrical potential gradient that produces a glow discharge therebetween and resultant heating thereof, depositing on the electrode units an evaporative coating, and removing the coated electrode units from the vacuum chamber. This process maximizes the efficiency of the heating process required to effectively evaporatively coat a substrate in a vacuum process.

According to a specific feature of the above method, the electrode units consist of hollow cylindrical electrode units and the glow discharge is produced internally and externally thereof. The intense hollow cathode discharge efficiently heats the electrode units.

According to another feature of the above method, the above described method includes the step of electrically isolating the individual electrode units from one another. Electrical isolation of the electrode units intensifies the discharge produced.

According to yet another feature, the disposing step includes mounting within the chamber a plurality of arrays of uniformly dimensioned, electrically connected cylindrical electrode units. This step facilitates the processing of multiple electrode units.

According to still other features of the invention, the above described method includes the steps of connecting the arrays to a power source during the heating period and both rotating and disconnecting the arrays from the power source during the depositing step.

Still another feature of the above methods includes the step of introducing resilient axial compression of the arrays. The resilient compression simplifies handling of the multiple units and compensates for thermally induced axial expansion thereof.

Another feature of the above described method includes a step of introducing argon into the chamber prior to the heating step. Ionized argon provides non-reactive, heavy ion bombardment of the units for heating purposes.

Another feature of the above described method includes the step of maintaining substantially open ends for the individual arrays. The open ends enhance the intensity of the flow discharge produced within the individual arrays.

Still another feature of the above method includes the step of applying a different output of a multi-phase power supply to each of the individual arrays. The application of multi-phase power to the individual arrays establishes a more uniform discharge therebetween and consequently more uniformed heating in addition to minimizing undesirable arcing within the vacuum chamber.

Yet another feature encompasses the introduction of a controlled percentage of oxygen to the chamber after the deposition step. The introduced oxygen quickly produces on the discharge heated electrode units a very uniform well-structured aluminum oxide barrier layer due to the reactivity of the two materials.

DESCRIPTION OF THE DRAWINGS

These and other objects and features of the invention will become more apparent upon a perusal of the following description taken in conjunction with the company drawings wherein:

FIGS. 2 and 3 are detailed views of structure shown in FIG. 1;

FIG. 6 is a schematic circuit diagram of an electrical supply for the apparatus shown in FIGS. 1-5;

FIG. 7 is a schematic detailed view of an electrical decoupling assembly shown in FIG. 1; and FIG. 8 is a schematic detailed view of a transition assembly shown in FIG. 1.

DESCRIPTION OF THE PREFERRED EMBODIMENT

Figure 1:
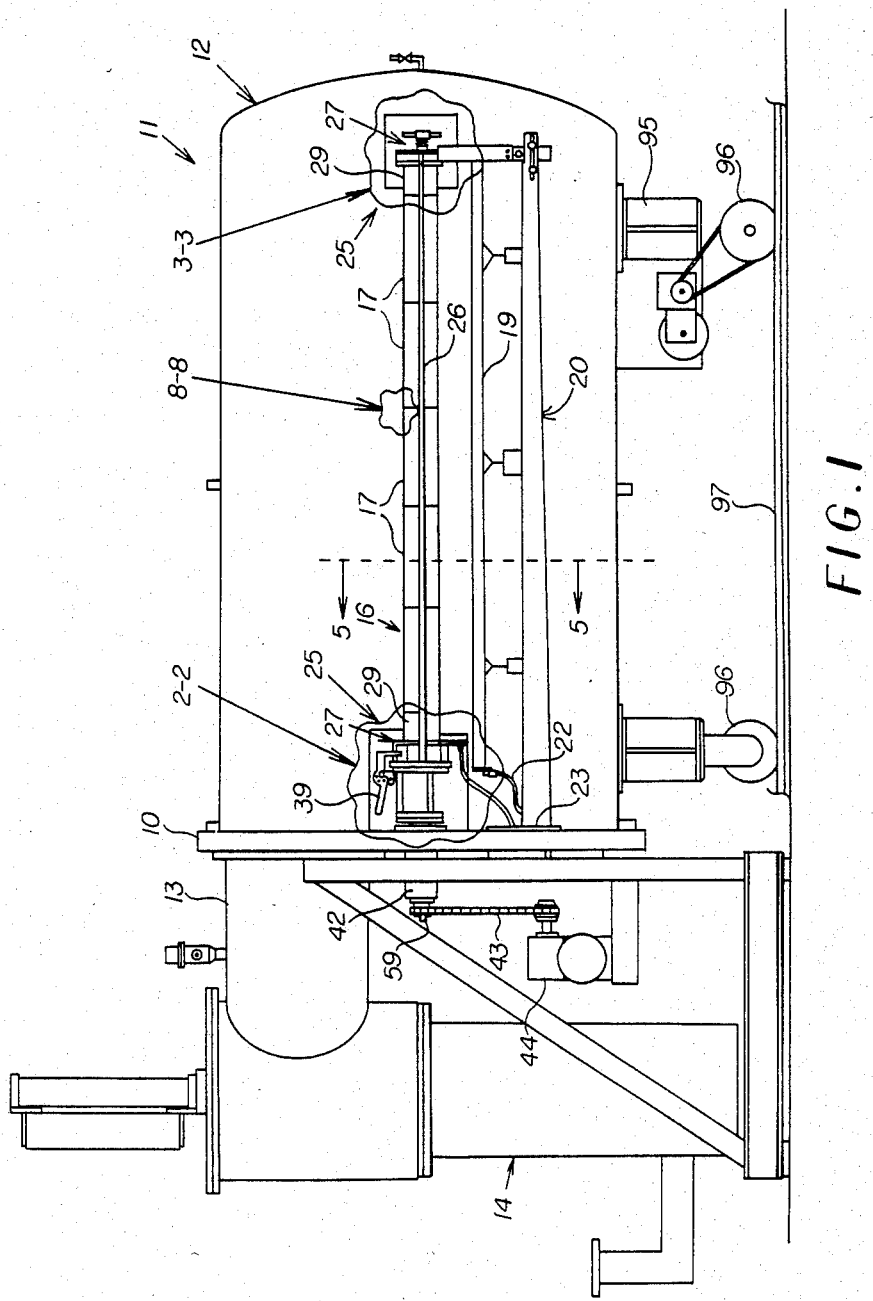
FIG. 1 is a schematic cutaway elevational view of a vacuum apparatus according to the invention.

Referring now to FIGS. 1-3 there is schematically illustrated a vacuum coating apparatus 11 according to the invention and including as a primary component a vacuum chamber 12. Communicating with the chamber 12 via a pipe section 13 and a valve 10 is a vacuum pump 14. Located within the chamber 12 is a mounting assembly 15 that supports a plurality of axially aligned arrays 16 of substrate units to be evaporatively coated. Each of the arrays 16 comprises a plurality of coaxially aligned, uniformly dimensioned hollow cylinders 17 joined by annular transition assemblies 18. In a preferred embodiment, each of the cylinders 17 is a hollow aluminum drum with an exterior surface to be coated with a photoreceptive material and subsequently used in reproduction equipment. Also disposed within the vacuum chamber 12 are sources 19 of evaporative coating which in a preferred embodiment consist of selenium filled crucibles mounted on a support assembly 20. Positive heating of the crucibles 19 is provided by elongated conductive bars 21 and cable conductors 22 that are accommodated by electrical feedthrus 23 in a bulkhead 24 of the vacuum chamber 12.

Figure 4:
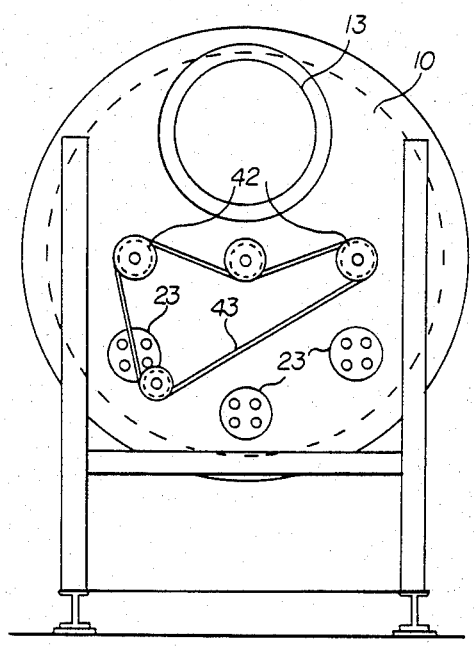
FIG. 4 is an end view of the vacuum coating apparatus shown in FIGS. 1 and 2.
Figure 5:
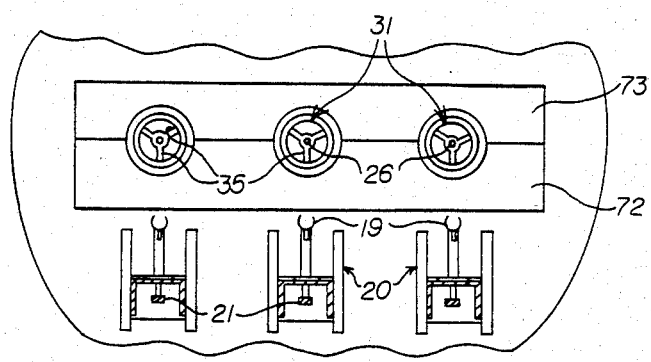
FIG. 5 is a partial, schematic cross sectional view taken along the lines 5—5 of FIG. 1.

The mounting assembly 15 includes a plurality of individual mandrels 25 each of which support one of the electrode arrays 16. Each of the mandrels 25 includes a center rod 26 extending axially through an array 16 and end piece assemblies 27 attached thereto. The end piece assemblies 27 each include an inner annular collar 28 having an internal groove that receives an electrically conductive spacer drum 29 having the same diameter as the units 17. Also included is each assembly 27 is an outer member 31 (FIG. 5) that is separated from an associated inner collar 28 by a plurality on electrical insulator spacers 32. Resilient axial compression of each array 16 is provided by a compression mechanism consisting of a threaded knob 33 and a spring member 34 resiliently compressed between the knob 33 and the outer member 31. As shown in FIG. 4, each outer member 31 is a spider member consisting of an outer ring and radial spokes 35, the inner ends of which receive the axial rod 26. The open end pieces 27 provide gas flow paths that enhance the production of an intense glow discharge within each of the arrays 16.

Each of the mandrels 25 is secured to a rotary spindle composed of inner and outer flanges 36, 37 joined by ceramic insulators 38. The inner flanges 36 are secured to the spider members 31 by mechanical clamps 39 and the outer flanges 37 are bolted to rotary feedthrus 42 located in the bulkhead 24 of the vacuum chamber 12. Separating the outer flanges 37 and the feedthrus 42 are insulator spacers 40. A drive chain 43 couples all of the rotary feedthrus 42 to a drive motor 44. Accommodated by the electrical feedthrus 23 are electrical leads 51 that couple an external power supply 52 (FIG. 6) to an inner member of each of the substrate electrode arrays 16. Connecting the end of each lead 51 to one of the axially aligned arrays 16 is an automatic decoupler assembly 53 that is described below. The temperature of each array 16 is sensed by a thermocouple 54 that feeds a signal to a control circuit 55 via a lead 56, a detachable coupling 57 and a lead 58 that is accommodated by an external slip ring assembly 59 on each of the rotary feedthrus 42.

Illustrated schematically in FIG. 6 is an electrical circuit for controlling the apparatus 11. Each of the arrays 16 is connected by one of the decouplers 53 and one of the leads 51 to a different output of the 3-phase power supply. The control circuit 54 receives temperature indicating signals from each of the thermocouples 54 via signal lines 56, 58 and 61. Connected in parallel to a heating power supply 58 by leads 21 are the resistively heated crucibles 19.

Referring now to FIG. 7 there is shown in greater detail the decoupler assembly 53 shown in FIG. 2. The electrical cable 51 is connected to an electrically conductive arm 63 having one end pivotally mounted on a bracket 64. The opposite end of the arm 63 supports a knife contact 65 that receives a blade contact 66 electrically connected to the inner ring member 28. As described below, in response to rotation of the array supporting rings 28, the knife contacts 65 are automatically disconnected from the blade contacts 66.

OPERATION

Three of the drum assembly arrays 16 are mounted on the rotating spindles within the vacuum chamber 12. Each drum assembly 16 is connected via feedthrus 22 to the three outputs of the 0–1000 V AC power supply 52. The vacuum chamber 12 is evacuated to remove reactive gases, typically to $5 \times 10^{-5}$ torr or better and then backfilled with argon to a pressure of approximately thirty (30) microns. The power supply 52 is then turned on and adjusted to 350–450 volts. With these conditions, a glow discharge will develop within the system. Two areas of plasma activity are established, one on the surface of the drums 17 and one very intensive hollow cathode glow within the length of each drum assembly array 16. The surface glow conditions and cleans by ion bombardment the surface of the drums 17 and the intense hollow cathode glow heats the drum very efficiently. Drum temperature can be raised from 20° C. to 75° C. within seven minutes with 250 watts of power per drum and 260° C. is achievable in approximately twenty minutes at 350 watts per drum.

The drums 17 are heated to the desired temperature dependent on the type of photoreceptor material to be deposited and the spectral response desired. Temperature measurements are provided by the thermocouples 54 placed on the end of each drum assembly 16. In many applications no measurable temperature gradient occurs across any individual drum 17 of any entire drum assembly array 16. This is because of the evenly distributed ionized gas activity along and within the drum assemblies 16. When the desired temperature has been achieved, the glow discharge power supply 52 is shut off, and the motor 44 energized to produce rotation of the arrays 16 on their spindles. In response to this rotation, the decoupler assemblies 53 disconnect each of the arrays 16 from the power supply 52. Activation of the heating supply 58 then heats the crucible 19 to effect deposition of photoreceptive material on the drums 17 in a conventional manner. During deposition, outside ends of the support mandrels are shielded from evaporant by cylinders 71 while inside ends are shielded by lower plates 72 and pivoted upper plates 73 as shown in FIGS. 2 and 3.

The invention provides a number of operational advantages not possible with prior systems. For example, compared to conventional drum heating techniques such as those using electron beams that require approximately 4000 watts per drum to heat in similar relative time periods, the glow discharge process typically uses no more than 250–350 watts per drum. Additionally, because of the 3-phase power configuration, voltage is applied only to the substrates 17. The walls of the vacuum chamber 12 are not used as an electrical potential for the glow discharge thereby eliminating power dissipation in the vacuum chamber. Another advantage of the 3-phase supply is an elimination of arcs and other intolerable problems such as sputtering or electrical connectors. Also eliminated is a problem associated with conventional electron beam and glow discharge techniques; that is the contamination of the substrate due to the release of material from cathodes, filaments, glow rods, or the chamber wall itself. Because the chamber is not electrically used nor is it in the vicinity of the glow, contamination from its surface is eliminated. Cathodes, filaments or glow rods are not used at all. The only object that is subject to the glow discharge is the drum 17 itself and it is removed at the end of the process and replaced with new drums each run.

In addition to the above described advantages, two major process steps also can be simplified and controlled. The first is the reduction of the complex cleaning process. The glow that exists on the outer surface of the drum 17 produces a considerable amount of ion bombardment which will result in final cleaning of the drum surface. Thus, precleaning can be reduced to simply an etching bath to eliminate the oxide layer normally existing on aluminum and a rinse. The second process step which can be changed is the growth of the aluminum oxide dielectric barrier layer. Since the plasma consists of pure argon which is inert, no ioxide layer will grow during the thermal preparation cycle. However, at the end of the thermal cycle and with the plasma power off or reduced, a controlled percentage of oxygen can be introduced with the argon or a controlled period of time. The oxygen coupled with the heated core aluminum drum 17 will produce a very uniform well-structured aluminum oxide layer quickly due to the reactivity of the two materials. By performing this step in the chamber, it results in a better, more controllable dielectric layer and eliminates the need for a separate oven and the additional cleaning steps required after growing the barrier layer, as well as the time and labor associated with these extra steps.

In certain coating applications involving a relatively large number of axially aligned electrode units 17 a temperature gradient can be developed along an array 16. This is thought to be primarily a result of the electrical voltage drop characteristics of the glow discharge plasma, but may also be a result of conductance pumping considerations of the electrode unit assemblies. To establish temperature uniformity in those cases, a transition assembly 81 shown in FIG. 8 is used between some or all contiguous pairs of units 17 in an array 16. The transition assembly 81 includes first and second annular members 82 and 83 that straddle a central band member 84. The first member 82 has a T-shaped cross-section defining a rim portion 85 and an inwardly directed ridge portion 86. Similarly, the second annular member 83 has an outer rim portion 87 and an inwardly directed ridge portion 88. The second member additionally includes a transversely extending, annular rim portion 89 that defines spaced apart slots 91 and overlays the band member 84. As shown in FIG. 8 the ends of contiguous drum units 17 engage, respectively, the outer surfaces of the ridges 86, 88 while the inner surfaces thereof retain the opposite edges of the band member 84 that defines a plurality of circumferentially spaced apart openings 92. During use of the transition assembly 81, the second annular member 83 is rotated on the band member 84 to produce a predetermined degree of registration between the slots 91 and the openings 92. In this way, a gas flow path of desired size can be created into the volume enclosed by the drum units 17. These gas flow paths allow plasma gas to enter between each drum as well as at the opened ends of the array 16. Tests have shown that the temperature gradient along the array is markedly affected by the gas flow settings of the transition assemblies 81, and a setting can be achieved that eliminates temperature variations along the length of the array.

After a given coating process has been completed the vacuum chamber 12 is opened and the individual drum units 17 are removed. To facilitate removal, a drive motor 95 is energized to move the chamber 12 away from the bulkhead 10 on wheels 96 along tracks 97. The clamps 39 are then rebased to allow removal of the mandrel supported arrays 16 from the chamber 12. Removal of the individual drum 17 is then accomplished by removing the nuts 33 to disassemble each mandrel.

Obviously, many modifications and variations of the present invention are possible in light of the above teachings. It is to be understood, therefore, that the invention can be practiced otherwise than as specifically described.

What is claimed is:

1. A vacuum deposition method comprising the following steps:
   providing a vacuum chamber;
   disposing within said chamber a plurality of substrate electrode units to be coated;
   reducing the pressure within said vacuum chamber;
   establishing between said electrode units an electrical potential gradient that produces a glow discharge therebetween and resultant heating thereof;
   sensing the temperature of said electrode units produced by said glow discharge heating thereof;
   evaporatively coating said electrode units after a predetermined electrode unit temperature is produced by said glow discharge heating and sensed during said sensing step; and
   removing said coated electrode units from said vacuum chamber.

2. A method according to claim 1 wherein said electrode units comprise hollow cylindrical electrode units and said glow discharge is produced internally and externally thereof.

3. A method according to claim 2 including the step of electrically isolating said electrode units from each other.

4. A method according to claim 3 wherein said disposing step comprises mounting within said chamber a plurality of arrays of uniformly dimensioned, electrically connected cylindrical electrode units.

5. A method according to claim 4 including the step of rotating said arrays during said coating step.

6. A method according to claim 5 including the steps of connecting said arrays to a power source during said heating period, and disconnecting said arrays therefrom during said coating step.

7. A method according to claim 6 including the step of providing gas flow paths into the ends for said arrays.

8. A method according to claim 4 wherein said establishing step comprises applying a different output of a multi-phase power supply to each of said arrays.

9. A method according to claim 8 wherein said reducing step comprises evacuating said chamber to a pressure below 100 millitorr.

10. A method according to claim 9 including the step of backfilling said chamber with an inert gas to a pressure of between 10 and 100 millitorr prior to said heating step.

11. A method according to claim 10 including the step of introducing into said chamber a controlled amount of oxygen after said heating step and before said coating step.

* * * * *